(12) United States Patent
Cho et al.

(10) Patent No.: US 9,472,675 B2
(45) Date of Patent: Oct. 18, 2016

(54) METHOD OF MANUFACTURING N-DOPED GRAPHENE AND ELECTRICAL COMPONENT USING NH₄F, AND GRAPHENE AND ELECTRICAL COMPONENT THEREBY

(71) Applicants: Korea Advanced Institute of Science and Technology, Daejeon (KR); Lam Research Corporation, Fremont, CA (US)

(72) Inventors: Byung Jin Cho, Daejeon (KR); Jae Hoon Bong, Gwangju (KR); Onejae Sul, Seoul (KR); Hyungsuk Alexander Yoon, San Jose, CA (US)

(73) Assignees: Korea Advanced Institute of Science and Technology, Daejeon (KR); Lam Research Corporation, Fremont, CA (US)

( * ) Notice: Subject to any disclaimer, the term of this patent is extended or adjusted under 35 U.S.C. 154(b) by 0 days.

(21) Appl. No.: 14/256,895

(22) Filed: Apr. 18, 2014

(65) Prior Publication Data
US 2015/0280011 A1    Oct. 1, 2015

(30) Foreign Application Priority Data

Mar. 26, 2014 (KR) ........................ 10-2014-0035302

(51) Int. Cl.
| | |
|---|---|
| *H01L 29/786* | (2006.01) |
| *H01L 21/22* | (2006.01) |
| *H01L 21/228* | (2006.01) |
| *H01L 29/16* | (2006.01) |

(52) U.S. Cl.
CPC ....... *H01L 29/78684* (2013.01); *H01L 21/228* (2013.01); *H01L 21/2225* (2013.01); *H01L 29/1606* (2013.01); *H01L 29/78603* (2013.01)

(58) Field of Classification Search
CPC ..................... H01L 29/1606; H01L 29/66015
See application file for complete search history.

(56) References Cited

U.S. PATENT DOCUMENTS

| | | | | |
|---|---|---|---|---|
| 2013/0261352 A1* | 10/2013 | Zhou | ................... | C01B 31/0438 570/129 |
| 2014/0239257 A1* | 8/2014 | Moon | ............... | H01L 29/78684 257/29 |

OTHER PUBLICATIONS

L.Lai et al., "*Exploration of the active center structure of nitrogen-doped graphene-based catalysts for oxygen reduction reaction*", Energy & Environmental Science, Mar. 30, 2012, vol. 5, pp. 7936-7942, The Royal Society of Chemistry 2012.
B. Guo et al., "*Controllable N-Doping of Graphene*", Nano Letters, vol. 10, pp. 4975-4980, Publ. on Web: Oct. 22, 2010.

\* cited by examiner

*Primary Examiner* — Matthew W Such
*Assistant Examiner* — David Spalla
(74) *Attorney, Agent, or Firm* — Martine Penilla Group, LLP (57) ABSTRACT

This disclosure relates to a method of manufacturing n-doped graphene and an electrical component using ammonium fluoride ($NH_4F$), and to graphene and an electrical component thereby. An example method of manufacturing n-doped graphene includes (a) preparing graphene and ammonium fluoride ($NH_4F$); and (b) exposing the graphene to the ammonium fluoride ($NH_4F$), wherein through (b), a fluorine layer is formed on part or all of upper and lower surfaces of a graphene layer, and ammonium ions are physisorbed to part or all of the upper and lower surfaces of the graphene layer or defects between carbon atoms of the graphene layer, thereby maintaining or further improving superior electrical properties of graphene including charge mobility while performing n-doping of graphene.

14 Claims, 5 Drawing Sheets

METHOD OF MANUFACTURING N-DOPED GRAPHENE AND ELECTRICAL COMPONENT USING NH4F, AND GRAPHENE AND ELECTRICAL COMPONENT THEREBY

CLAIM OF PRIORITY

This application claims priority from Korean Application No. 10-2014-0035302, filed on Mar. 26, 2014, entitled "Method of manufacturing n-doped graphene and electrical component using $NH_4F$, and graphene and electrical component thereby, which is herein incorporated by reference.

BACKGROUND OF THE INVENTION

1. Field of the Invention

The present invention relates to a method of manufacturing n-doped graphene and an electrical component, and to graphene and an electrical component thereby. More particularly, the present invention relates to a method of manufacturing n-doped graphene and an electrical component using ammonium fluoride ($NH_4F$), and to graphene and an electrical component thereby.

2. Description of the Related Art

Recently, attempts are being made to develop a variety of materials using nanotechnology able to outperform properties of conventional materials. A typical example of such a material is graphene. Graphene is a material having a two dimensional planar structure of carbon atoms which are bonded to each other, and has diverse advantages including high charge mobility, superior mechanical strength, transparency, etc. It may be prepared using currently available semiconductor processing techniques and is thus gaining attention as a next-generation material.

An electronic material to which graphene is applied is typically exemplified by a transistor channel having a high operating speed thanks to high charge mobility. Furthermore, when it is applied to a field effect transistor (FET), the operating frequency may be drastically improved. However, forming an electrical component such as FET using graphene as above essentially requires a doping process of graphene with electrons or holes. As such, hole doping, namely, p-doping occurs naturally in the course of preparation of graphene, thus obviating an additional process, but electron doping, namely, n-doping needs an additional process.

N-doping processes developed to date may be classified into growth process and post-growth process types. A typical example of the growth process type is chemical vapor deposition (CVD). This process may be applied to manufacture pure graphene, but may be used in such a manner that a gas (nitrogen or ammonia gas) containing a nitrogen atom may be added to a gas feed, so that the nitrogen atom is injected to bonds between carbon atoms in coincidence with growing graphene. In the case where FET is made using n-type graphene thus grown, charge mobility is measured to be about 200~450 $cm^2/V$ sec based on a field effect.

Examples of the post-growth process type include a thermal treatment process and a plasma treatment process, and the thermal treatment process may be subdivided into a process using gas and a process using a high-temperature solution. The process using gas is performed in such a manner that oxidized graphene (graphene oxide) is placed in a gas chamber filled with ammonia gas, and then reduced through thermal treatment at high temperature and simultaneously n-doping is executed. Similarly, the process using a solution implements to reduction and doping while heating oxidized graphene up to about 200° C. in an ammonia aqueous solution. However, the above thermal treatment process is problematic because oxidized graphene, which is mainly used, is unlikely to return to graphene having original high charge mobility even when reduced.

The plasma treatment process is performed by generating plasma in a gas chamber filled with ammonium or nitrogen gas and then bringing such plasma into immediate contact with graphene to thus inject a nitrogen atom. This method is advantageous because large-area high-quality graphene grown using CVD may be subjected to electron doping, but is disadvantageous because a plurality of carbon-oxygen bonds in graphene may be generated as by-product after plasma treatment, remarkably degrading electrical properties of graphene.

Figure 1:
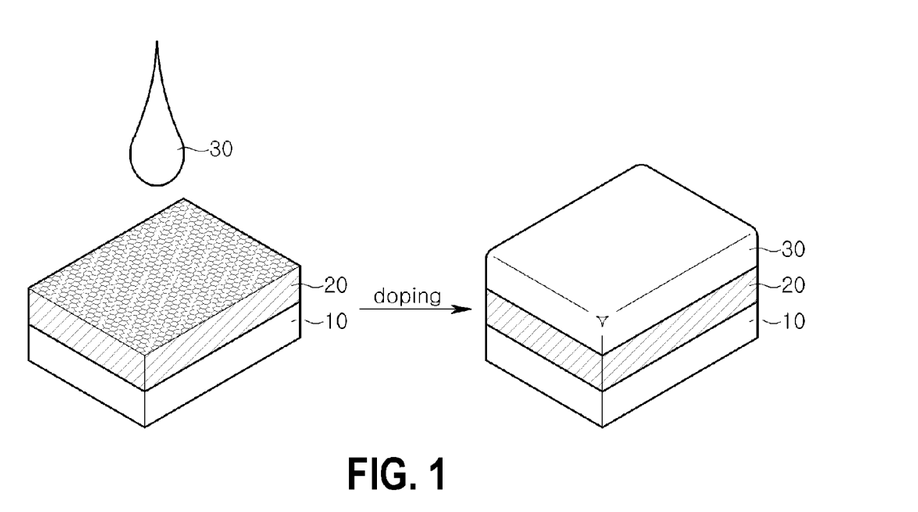
FIG. 1 is a view illustrating an n-doping process of graphene using a doping solution according to a conventional technique.

Moreover, Korean Patent Application Publication No. 10-2012-0099910 (published on Sep. 12, 2012) discloses an n-doping process of graphene comprising reacting a reactive gas containing a carbon source and heat on a substrate 10 to grow graphene 20 on the substrate 10, and doping such graphene 20 by use of a vapor or a doping solution 30 containing an n-type dopant. FIG. 1 illustrates an n-doping process of graphene 20 using a doping solution 30 according to the above conventional technique. However, even when such a method is used, the above conventional problems are difficult to fundamentally solve.

Although the aforementioned conventional methods enable n-doping of graphene, electrical properties of graphene including charge mobility may be remarkably degraded. Therefore, the demand for n-doping methods of graphene while maintaining or improving electrical properties of graphene is continuously increasing but appropriate solutions therefor have not yet been proposed.

SUMMARY OF THE INVENTION

Accordingly, the present invention has been made keeping in mind the above problems encountered in the related art, and an object of the present invention is to provide a method of manufacturing n-doped graphene and an electrical component, and graphene and an electrical component thereby, wherein superior electrical properties of graphene, including charge mobility, may be maintained or further improved, while graphene is n-doped.

In order to accomplish the above object, an aspect of the present invention provides a method of manufacturing n-doped graphene, comprising (a) preparing graphene and ammonium fluoride ($NH_4F$); and (b) exposing the graphene to ammonium fluoride ($NH_4F$), wherein through (b), a fluorine layer is formed on part or all of upper and lower surfaces of a graphene layer, and ammonium ions are physisorbed to part or all of the upper and lower surfaces of the graphene layer or defects between carbon atoms of the graphene layer.

Exposing the graphene to ammonium fluoride ($NH_4F$) in (b) may be performed using any one or a combination of two or more selected from among a process of immersing graphene in an ammonium fluoride ($NH_4F$) aqueous solution, a process of spraying an ammonium fluoride ($NH_4F$) aqueous solution onto graphene, a process of exposing graphene to an ammonium fluoride ($NH_4F$) vapor, and a process of spin coating graphene with an ammonium fluoride ($NH_4F$) aqueous solution.

The extent of doping of the graphene in (b) may be controlled by adjusting at least one of a concentration, a temperature and a treatment time of the ammonium fluoride (NH$_4$F) aqueous solution to a predetermined range.

The method may further comprise (b1) thermally treating the graphene exposed to ammonium fluoride (NH$_4$F), subsequent to (b).

Also, thermally treating in (b1) may be performed under the process condition that part or all of the ammonium ions physisorbed to the graphene may be converted into pyrrolic-N, pyridinic-N, or graphitic-N.

Another aspect of the present invention provides a method of manufacturing an electrical component including n-doped graphene, comprising (c) forming graphene on a substrate; (d) forming source and drain electrodes; (e) etching the graphene, thus forming a graphene pattern; and (f) exposing the graphene pattern formed on the substrate to ammonium fluoride (NH$_4$F).

In (c), the substrate may comprise silicon nitride, silicon oxide, polyethylene terephthalate or polyimide.

Exposing the graphene pattern to ammonium fluoride (NH$_4$F) in (f) may be performed using any one or a combination of two or more selected from among a process of immersing a substrate having a graphene pattern in an ammonium fluoride (NH$_4$F) aqueous solution, a process of spraying an ammonium fluoride (NH$_4$F) aqueous solution onto a graphene channel, a process of exposing a graphene channel to an ammonium fluoride (NH$_4$F) vapor, and a process of spin coating a graphene channel with an ammonium fluoride (NH$_4$F) aqueous solution.

The extent of doping of the graphene pattern in (f) may be controlled by adjusting at least one of a concentration, a temperature and a treatment time of the ammonium fluoride (NH$_4$F) aqueous solution to a predetermined range.

The method may further comprise (g) thermally treating the graphene pattern exposed to ammonium fluoride (NH$_4$F), subsequent to (f).

As such, thermally treating in (g) may be performed under the process condition that part or all of the ammonium ions physisorbed to the graphene pattern may be converted into pyrrolic-N, pyridinic-N, or graphitic-N.

The method may further comprise (h) forming a protective film on the graphene pattern, subsequent to (f).

Forming the protective film in (h) may be performed using any one process selected from among atomic layer deposition, chemical vapor deposition, spin coating, and screen printing.

In (h), the protective film may comprise any one selected from among Aluminum oxide, Silicon oxide, Hafnium oxide, Zirconium oxide, Lanthanum oxide, Tungsten oxide, Boron nitride, Polyvinylpyrrolidone, Polyvinylphenol, Polytrivinyltrimethylcyclotrisiloxane(pV3D3) and Polytetravinyltetramethykyclotetrasiloxane(pV4D4).

Still another aspect of the present invention provides n-doped graphene, comprising a graphene layer; and a fluorine layer formed on part or all of upper and lower surfaces of the graphene layer, wherein ammonium ions are physisorbed to part or all of the upper and lower surfaces of the graphene layer or defects between carbon atoms of the graphene layer.

As such, part of the carbon atoms of the graphene layer may be substituted with pyrrolic-N, pyridinic-N, or graphitic-N.

Yet another aspect of the present invention provides an electrical component including n-doped graphene, comprising the n-doped graphene as above; a substrate having the n-doped graphene formed on an upper surface thereof; and electrodes.

The substrate may comprise silicon nitride, silicon oxide, polyethylene terephthalate or polyimide.

Also, a channel of a transistor may be formed by the n-doped graphene, a source and a drain may be formed by the electrodes, and a gate electrode may be further formed on a lower surface of the substrate, thus forming a field effect transistor.

As the gate electrode, a global back-gate comprising a high-concentration doped silicon layer may be used.

The electrical component may further comprise a protective film formed on the upper surface of the n-doped graphene.

The protective film may comprise any one selected from among Aluminum oxide, Silicon oxide, Hafnium oxide, Zirconium oxide, Lanthanum oxide, Tungsten oxide, Boron nitride, Polyvinylpyrrolidone, Polyvinylphenol, Polytrivinyltrimethylcyclotrisiloxane(pV3D3) and Polytetravinyltetramethylcyclotetrasiloxane(pV4D4).

BRIEF DESCRIPTION OF THE DRAWINGS

The above and other objects, features and advantages of the present invention will be more clearly understood from the following detailed description taken in conjunction with the accompanying drawings regarding concept views and graphs showing results after n-doping which are partially incorporated into the detailed description to aid the understanding of the present invention, in which.

DESCRIPTION OF SPECIFIC EMBODIMENTS

The present invention may be modified variously and may have a variety of embodiments, and below is a detailed description of specific embodiments with reference to the appended drawings.

In the following description, it is to be noted that, when a detailed description of known techniques related with the present invention may make the gist of the present invention unclear, it will be omitted.

The terms such as first, second, etc. may be used to describe diverse elements, and such elements are not limited to the above terms, and these terms are merely used to discriminate one element from the other element.

The conventional case of forming n-doped graphene using a growth process such as CVD or a post-growth process such as thermal treatment or plasma treatment may be problematic because electrical properties of graphene, including charge mobility, may remarkably deteriorate. Hence, the present invention provides a method of manufacturing n-doped graphene and an electrical component, and graphene and an electrical component thereby, wherein graphene is doped using ammonium fluoride ($NH_4F$) or is also thermally treated, so that graphene is enclosed with fluorine ions to thus decrease scattering due to collision with an external material such as a water molecule which causes energy loss upon movement of charges in graphene, and ammonium ions are physisorbed to the upper and lower surfaces of graphene or defects of carbon-carbon bonds of graphene, without production of new defects which obstruct the movement of charges, or a carbon atom is substituted with a nitrogen atom, thereby maintaining or further improving superior electrical properties of graphene including charge mobility while performing n-doping of graphene.

Useful in the present invention, an ammonium fluoride ($NH_4F$) aqueous solution may vary in terms of diverse conditions including concentration, temperature and treatment time and may have various exemplary embodiments. Below is a detailed description of the principle and results of doping regardless of specific conditions of doping factors.

Figure 2:
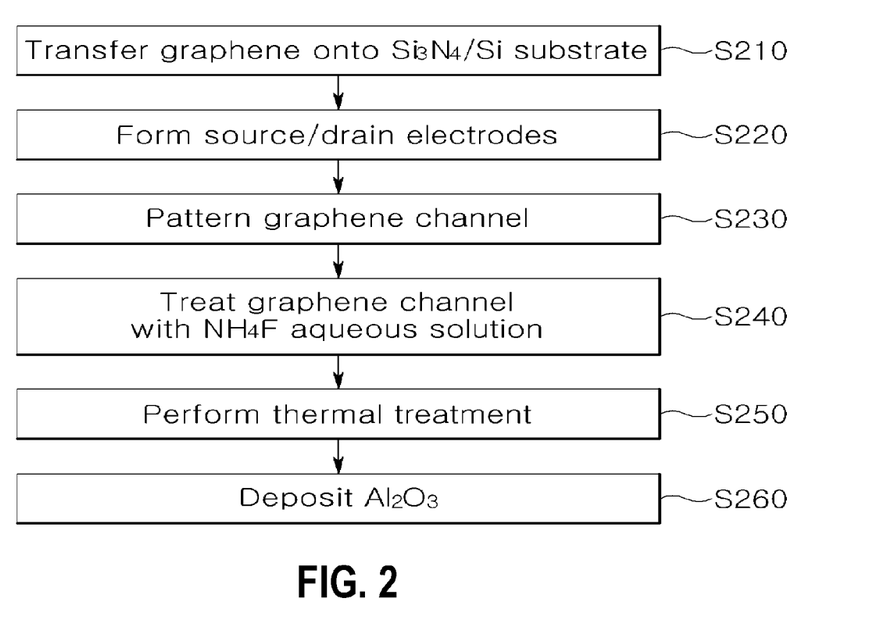
FIG. 2 is a flowchart illustrating a process of manufacturing an electrical component including n-doped graphene using an ammonium fluoride aqueous solution according to an embodiment of the present invention.

FIG. 2 illustrates a flowchart of a process of manufacturing an electrical component including n-doped graphene using an ammonium fluoride ($NH_4F$) aqueous solution according to an embodiment of the present invention. As illustrated in FIG. 2, the method of manufacturing an electrical component including n-doped graphene using an ammonium fluoride aqueous solution according to an embodiment of the present invention includes transferring graphene onto a silicon nitride/silicon ($Si_3N_4/Si$) substrate (S210), forming source/drain electrodes (S220), patterning a graphene channel (S230), treating the graphene channel with an ammonium fluoride aqueous solution (S240), performing thermal treatment (S250), and depositing aluminum oxide ($Al_2O_3$) (S260).

The method of manufacturing an electrical component including n-doped graphene using an $NH_4F$ aqueous solution according to an embodiment of the present invention is stepwisely specified below. First, the step of transferring graphene onto the silicon nitride/silicon ($Si_3N_4/Si$) substrate (S210) is as follows. In this step, a prepared graphene sheet is transferred onto a prepared silicon nitride/silicon ($Si_3N_4/Si$) substrate, thereby forming a basic structure for manufacturing an electrical component.

Upon manufacturing a test sample according to a specific embodiment of the present invention, the substrate is configured such that silicon nitride ($Si_3N_4$) is deposited to a thickness of 90 nm on a silicon (Si) layer, and the silicon layer is composed of p+ doped Si so as to be used as a back-gate electrode. As such, silicon nitride ($Si_3N_4$) functions as an insulator, and may be formed using a process such as low pressure CVD, plasma enhanced CVD, etc.

Instead of the silicon nitride/silicon ($Si_3N_4/Si$) substrate, any substrate such as silicon oxide/silicon, polyethylene terephthalate or polyimide may also be used so long as graphene is transferred thereto.

Subsequently, graphene is transferred onto the prepared silicon nitride/silicon ($Si_3NH_4/Si$) substrate using a wet transfer method or a dry transfer method.

Furthermore, the preformed graphene sheet is not necessarily transferred, and in some cases, graphene may be directly formed on the silicon nitride/silicon ($Si_3N_4/Si$) substrate by way of an appropriate process.

Subsequently, the source/drain electrodes are formed (S220). The source/drain electrodes constitute the electrodes of a field effect transistor (FET). In an embodiment of the present invention, the test sample is manufactured using gold (Au) as the metal for these electrodes, and an adhesive layer is formed of palladium (Pd) to enhance adhesion of gold. The material for the adhesive layer is not necessarily limited to Pd, but any metal may be used without particular limitation so long as it is able to enhance adhesion between gold and the substrate. To form a desired electrode pattern using the above metal, lithography is performed using a negative photoresist, and the electrode metal is deposited using CVD, followed by a lift-off process.

Subsequently, the graphene channel is patterned (S230). To make a channel having a desired width and length, lithography is performed using a positive photoresist, after which the region other than the graphene channel is etched using oxygen plasma.

Subsequently, the graphene channel is treated with an ammonium fluoride aqueous solution (S240). The substrate having the graphene channel manufactured by way of the above series of procedures is immersed in the ammonium fluoride aqueous solution, so that the graphene channel is n-doped. As such, the extent of doping may vary depending on the concentration, temperature, and time of the ammonium fluoride aqueous solution. Taking into consideration the foregoing, it is preferred that the above process conditions be determined in advance.

Figure 3:
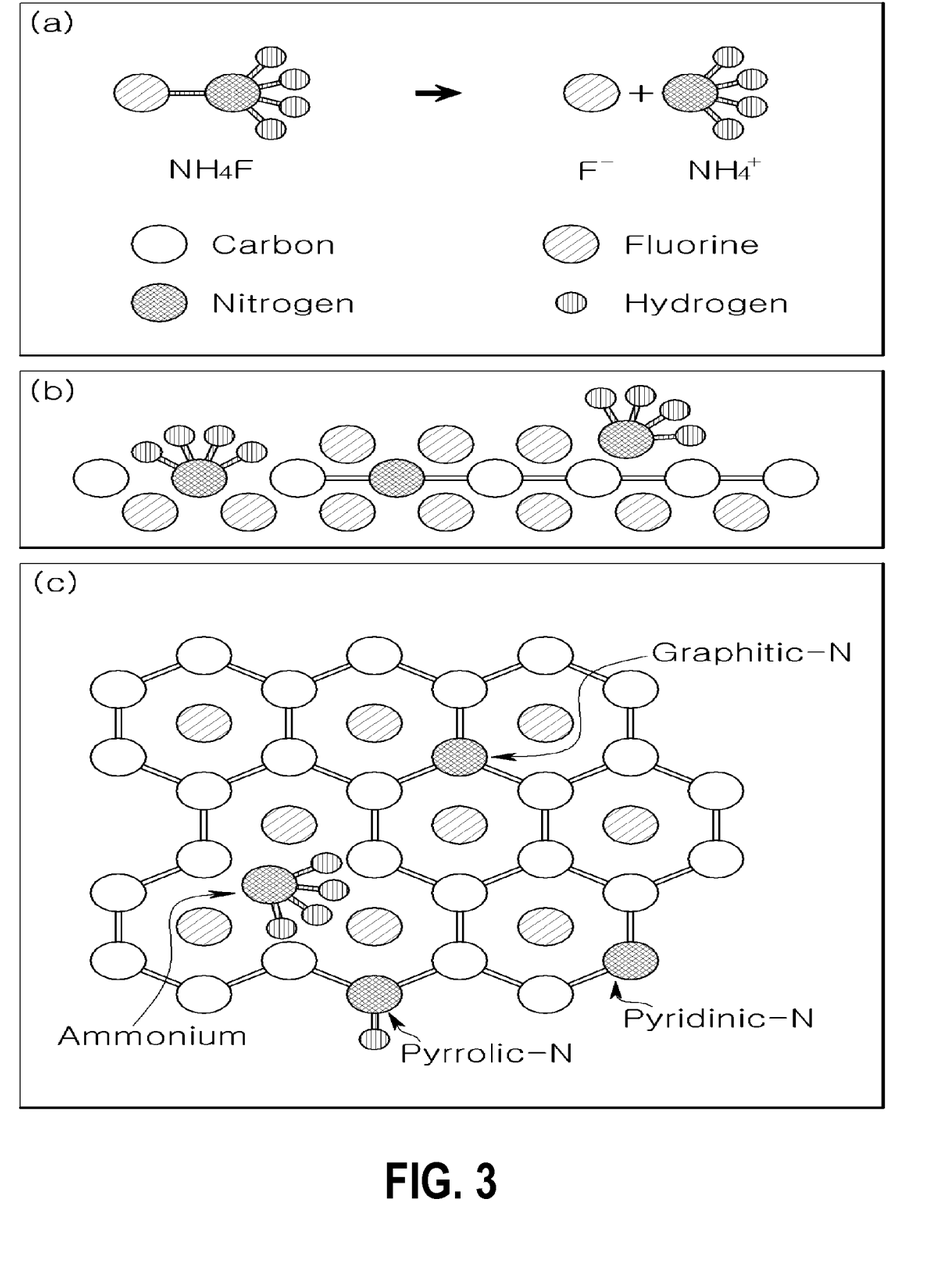
FIGS. 3(a), 3(b) and 3(c) are views illustrating an n-doping principle using an ammonium fluoride aqueous solution according to an embodiment of the present invention.

As illustrated in FIG. 3(a), ammonium fluoride ($NH_4F$) is provided in the form of a fluorine ion ($F^-$) and an ammonium ion ($NH_4^{30}$) as an atomic group in the aqueous solution. Thus, when graphene is immersed therein, as illustrated in FIG. 3(b), graphene is enclosed with fluorine ions ($F^-$), and the ammonium ions ($NH_4^+$) are physiosorbed onto the surface of graphene or physiosorbed to defects existing in graphene, that is, disconnection or mismatching points of bonds between carbon atoms of graphene. Without production of new defects which obstruct movement of charges in graphene, n-doping may be implemented, and thus n-doped graphene may be manufactured while maintaining or further improving superior electrical properties of graphene including charge mobility.

Also, in addition to immersing the substrate having the graphene channel in the ammonium fluoride aqueous solution as above, a process of spraying an ammonium fluoride ($NH_4F$) aqueous solution onto a graphene channel, a process of exposing a graphene channel to an ammonium fluoride ($NH_4F$) vapor, or a process of spin coating a graphene channel with an ammonium fluoride ($NH_4F$) aqueous solution may be used, as necessary.

Subsequently, to more stably make n-doped graphene, a thermal treatment process is performed (S250). By means of the thermal treatment process, as illustrated in FIG. 3(c), part or all of the ammonium ions of ammonium fluoride ($NH_4F$) may be converted into pyrrolic-N, pyridinic-N, or graphitic-N, and thereby, the ammonium ions may be prevented from being separated depending on the external conditions due to volatilization, etc., thus achieving a more stable structure.

More specifically, in an embodiment of the present invention, the thermal treatment process is performed in a vacuum atmosphere of $2 \times 10^{-6}$ Torr at 300° C. for 10 hr. As such, the process conditions such as pressure, temperature and time may vary depending on needs.

Finally, aluminum oxide ($Al_2O_3$) is deposited (S260). In order to more stably maintain the n-doping effect in this step, a protective film made of aluminum oxide ($Al_2O_3$) is formed on the graphene channel, thereby suppressing deterioration of graphene properties under external conditions. In addition to $Al_2O_3$ for the protective film, any material such as Silicon oxide, Hafnium oxide, Zirconium oxide, Lanthanum oxide, Tungsten oxide, Boron nitride, Polyvinylpyrrolidone, Polyvinylphenol, Polytrivinyltrimethylcyclotrisiloxane(pV3D3), Polytetravinyltetramethykyclotetrasiloxane(pV4D4), etc. may be used without particular limitation so long as it does not decrease properties of graphene and may prevent contact with the outside.

The protective film may be formed using any one process appropriately selected from among atomic layer deposition (ALD), CVD, spin coating and screen printing, in consideration of the properties of the substrate.

As for the test sample in an embodiment of the present invention, $Al_2O_3$ is deposited to a thickness of 5 nm using ALD.

Specifically, FIGS. 3(a) to 3(c) show the phenomenon occurring upon thermal treatment of graphene immersed in the ammonium fluoride ($NH_4F$) aqueous solution. As illustrated in FIG. 3(a), ammonium fluoride is divided into fluorine ions ($F^-$) and ammonium ions ($NH_4^+$) in the aqueous solution. Because fluorine ions ($F^-$) are negatively charged, they are attached to the surface of positively charged graphene so that graphene is electrically neutral. If only the fluorine ions are present, Dirac voltage of graphene amounts to 0 V. When the surface of graphene is enclosed with fluorine ions, graphene is blocked from atomic contact with external materials such as water molecules and ions, and thus upon movement of charges in graphene, the extent of scattering by the external materials may decrease, thereby improving charge mobility.

On the other hand, while the ammonium ions ($NH_4^+$) are attached to the surface of graphene or the defects of carbon-carbon bonds thereof, they donate electrons, and thereby neutral graphene is negatively charged again, and n-(electron) doping is carried out with a Dirac voltage being changed to less than 0 V.

Also, in order to achieve electron doping as desired, it is preferred that the amount of the defects between carbon atoms of graphene be decreased or increased by the post-growth process, or that the concentration, temperature, and time upon treatment with the ammonium fluoride aqueous solution be adjusted.

Furthermore, as graphene is thermally treated, part or all of the ammonium ions may be converted into pyrrolic-N, pyridinic-N, or graphitic-N, thus forming the structure shown in FIG. 3(b) or 3(c), leading to a more stable structure.

Figure 4A:
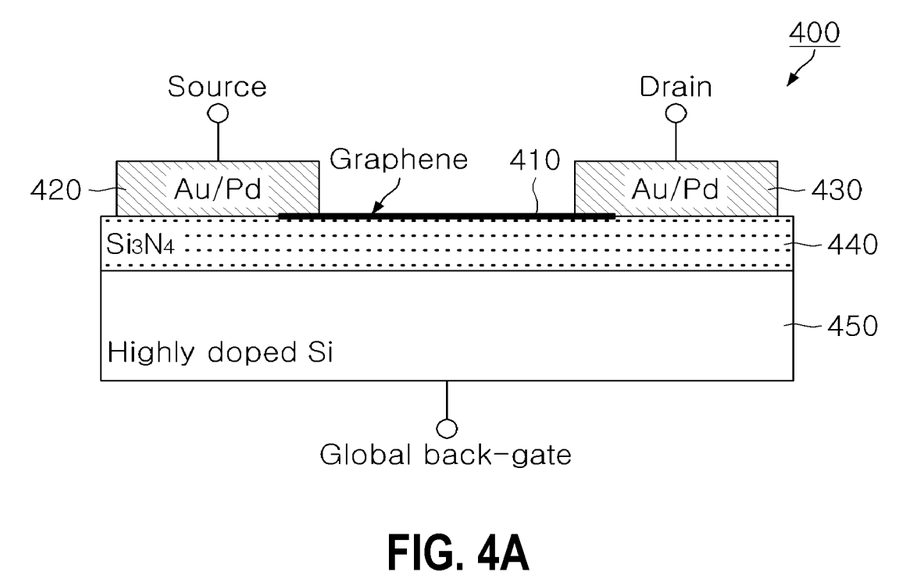
FIGS. 4A, 4B and 4C are views illustrating a back-gate transistor using graphene and a doping process therefor according to an embodiment of the present invention.
Figure 4B:
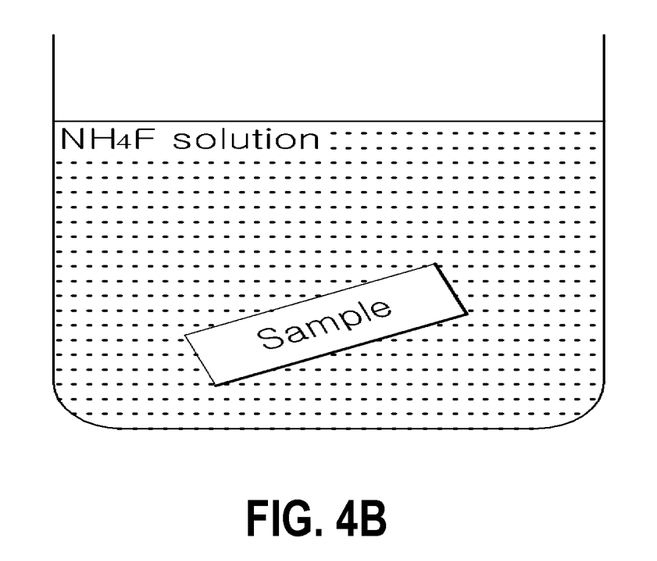
Figure 4C:
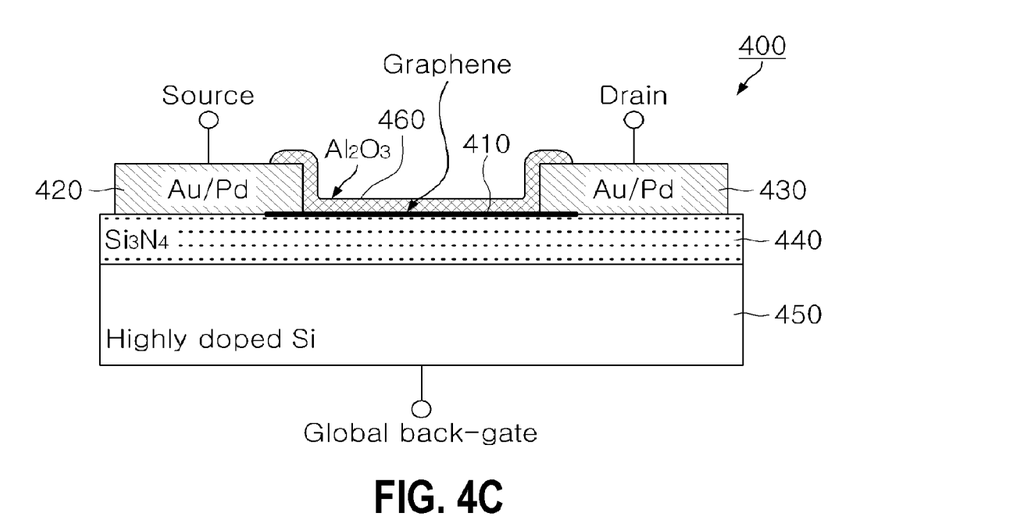

FIGS. 4A, 4B and 4C illustrate a back-gate transistor 400 using graphene and a doping process therefor. FIG. 4A illustrates the structure of the back-gate transistor 400 using graphene, and FIG. 4B schematically illustrates the n-doping process. FIG. 4C is a cross-sectional view illustrating the back-gate transistor using n-doped graphene wherein the protective film is further provided.

As illustrated in FIG. 4A, the back-gate transistor 400 using graphene is configured such that a silicon nitride layer 440 is deposited on a high-concentration doped silicon layer 450 to form a substrate, and graphene 410 is transferred onto the substrate, and electrode metals Au/Pd are deposited to form a source 420 and a drain 430. The high-concentration doped silicon layer 450 is used as a global back-gate electrode and the silicon nitride layer 440 functions as an insulator, and thus a back-gate transistor using the graphene 410 as a channel is operated.

FIG. 4B schematically illustrates the n-doping process of graphene. Specifically, a predetermined amount of ammonium fluoride aqueous solution is placed in a vessel such as a Teflon beaker, and the prepared sample is immersed therein for a predetermined period of time, thereby completing the n-doping process of graphene.

FIG. 4C illustrates the structure in which the protective film is formed by depositing an aluminum oxide film 460 on the surface of the graphene 410 to maintain stable n-doping.

As mentioned above, when the back-gate transistor is formed using graphene, superior electrical properties of graphene including high charge mobility may be maintained, and also n-doped graphene channel may be provided. Compared to conventional electrical components, electrical properties including operating speed or operating frequency may be greatly improved. Moreover, as seen in FIG. 4C, the electrical component further includes the protective film such as the aluminum oxide film 460, thus preventing the properties of the graphene channel from deteriorating due to external conditions, thereby obtaining an electrical component which more stably operates.

Figure 5:
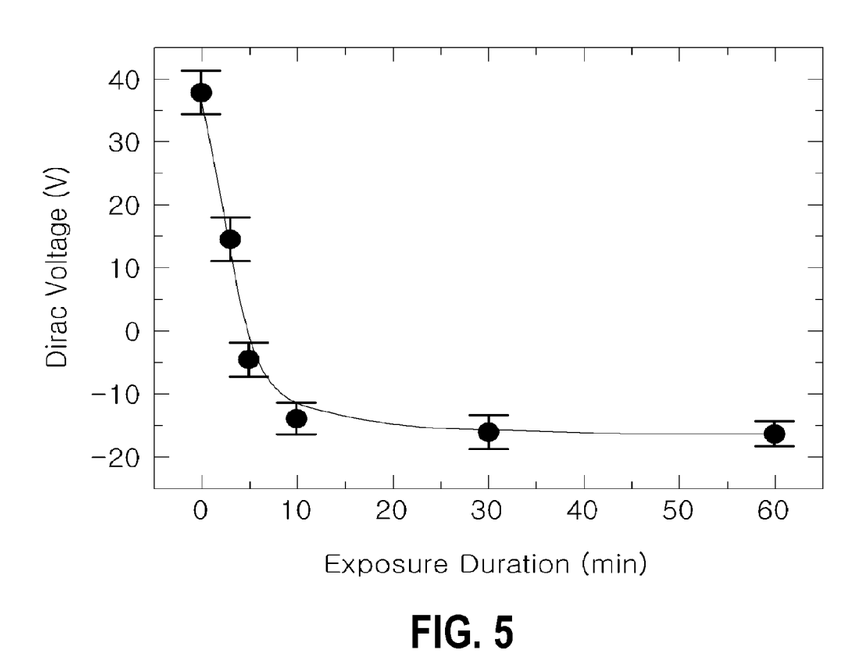
FIG. 5 is a graph illustrating Dirac voltage of n-doped graphene depending on the aqueous solution treatment time according to an embodiment of the present invention.

FIG. 5 is a graph illustrating changes in Dirac voltage depending on the treatment time of the ammonium fluoride aqueous solution. As illustrated in FIG. 5, as the treatment time increases, Dirac voltage is changed to a negative value (electron doping) via 0 V from a positive value (hole doping), which was confirmed experimentally.

The concentration of the ammonium fluoride aqueous solution used is 40%, which may vary to adjust the amount of doped graphene and the exposure time. As illustrated in FIG. 5, when the exposure time of the substrate to the aqueous solution is set to 10 min or more based on the mass concentration of 40%, doping may become saturated. As such, it may be naturally differently set depending on the concentration and the temperature of the aqueous solution.

Figure 6:
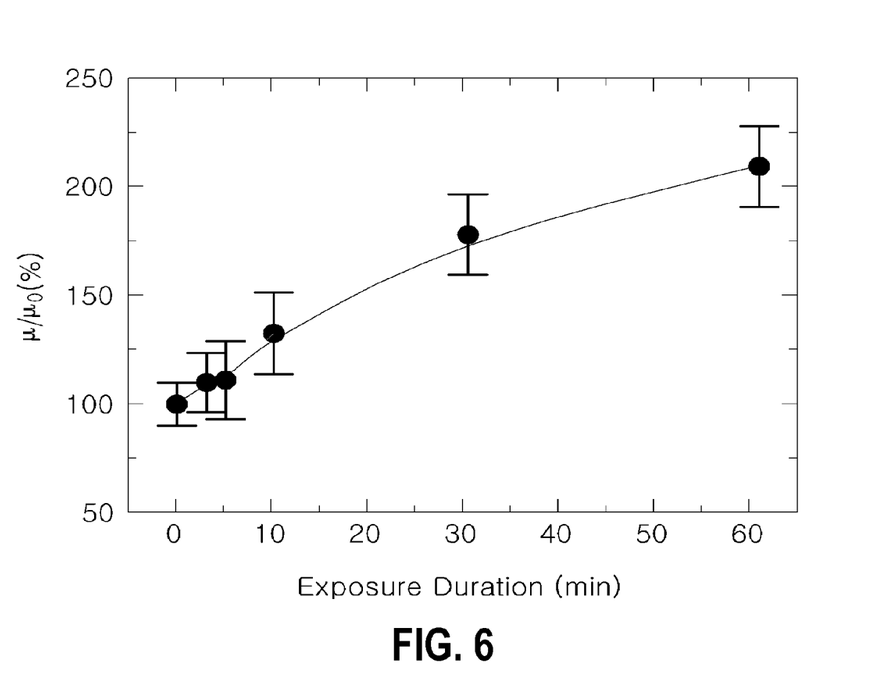
FIG. 6 is a graph illustrating charge mobility of graphene depending on the aqueous solution treatment time according to an embodiment of the present invention.

FIG. 6 is a graph illustrating changes in charge mobility before and after treatment with the ammonium fluoride aqueous solution. As illustrated in FIG. 6, after n-(electron) doping, charge mobility of graphene is not decreased but is increased, unlike conventional n-doping. Thus, the properties of the n-doped graphene according to the present invention and the electrical component using the same may be greatly improved.

Figure 7:
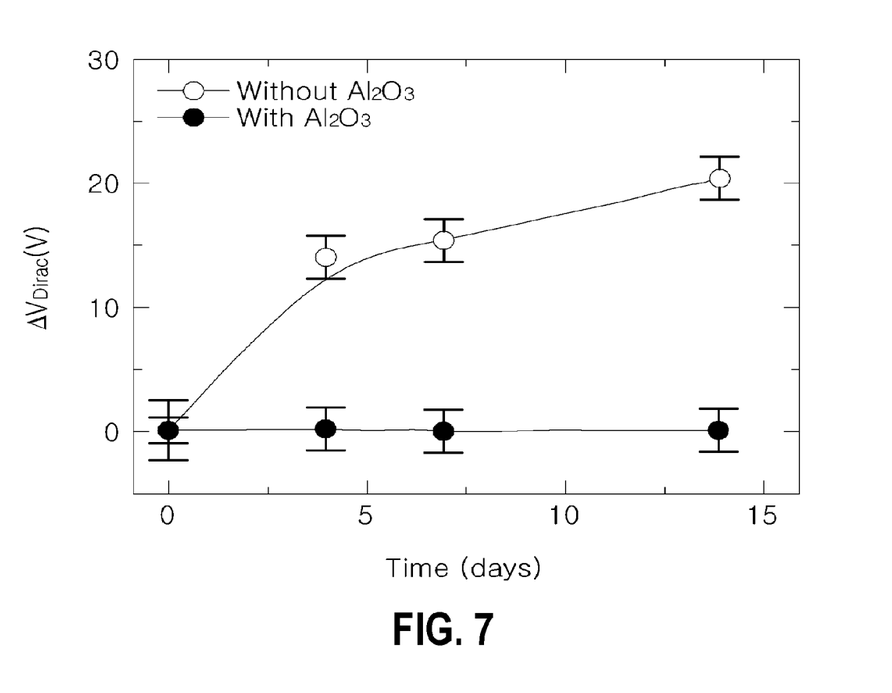
FIG. 7 is a graph illustrating Dirac voltage of aluminum oxide-treated graphene over time according to an embodiment of the present invention.

FIG. 7 is a graph illustrating maintenance of the doping effect over time in air when a 5 nm thick aluminum oxide film is deposited on the n-doped graphene. When the aluminum oxide film is not deposited, the graphene is p-doped again by moisture and oxygen in air over time and thus Dirac voltage is changed to a positive value. In contrast, when the aluminum oxide film is deposited, Dirac voltage is not remarkably changed over time in air. Accordingly, formation of the protective film on graphene enables the doping effect of graphene to be maintained for a long period of time.

As described hereinbefore, the present invention provides a method of manufacturing n-doped graphene and an electrical component, and n-doped graphene and an electrical component thereby. According to the present invention, as graphene is doped using ammonium fluoride ($NH_4F$) or is also thermally treated, graphene is enclosed with fluorine ions to thus decrease scattering due to collision with an external material which causes energy loss upon movement of charges in graphene. Furthermore, ammonium ions can be physisorbed to the upper and lower surfaces of graphene or defects of carbon-carbon bonds of graphene, without production of new defects which obstruct the movement of charges, or a carbon atom can be substituted with a nitrogen atom. Thereby, superior electrical properties of graphene including charge mobility can be maintained or further improved while performing n-doping of graphene.

Although the preferred embodiments of the present invention have been disclosed for illustrative purposes, those skilled in the art will appreciate that various modifications, additions and substitutions are possible, without departing from the scope and spirit of the invention as disclosed in the accompanying claims Thus, the embodiments of the present invention do not limit the spirit of the invention but are construed to explain it. Furthermore, it is to be understood that the scope of protection of the invention is set forth by the following claims, and all the technical ideas within the range equivalent thereto are incorporated into the scope of the invention.

What is claimed is:

1. A method of manufacturing n-doped graphene, comprising:
    (a) preparing graphene and ammonium fluoride ($NH_4F$); and
    (b) exposing the graphene to the ammonium fluoride ($NH_4F$),
    wherein through (b), a fluorine layer is formed on part or all of upper and lower surfaces of a graphene layer, and ammonium ions are physisorbed to part or all of the upper and lower surfaces of the graphene layer or defects between carbon atoms of the graphene layer;
    wherein exposing the graphene to the ammonium fluoride ($NH_4F$) in (b) is performed using any one or a combination of two or more selected from among process of immersing graphene in an ammonium fluoride ($NH_4F$) aqueous solution, a process of spraying an ammonium fluoride ($NH_4F$) aqueous solution onto graphene, and a process of spin coating graphene with an ammonium fluoride ($NH_4F$) aqueous solution.

2. The method of claim 1, wherein exposing the graphene to the ammonium fluoride ($NH_4F$) in (b) is additionally performed using a process of exposing graphene to an ammonium fluoride ($NH_4F$) vapor.

3. The method of claim 1, wherein an extent of doping of the graphene in (b) is controlled by adjusting at least one of a concentration, a temperature and a treatment time of the ammonium fluoride ($NH_4F$) aqueous solution to a predetermined range.

4. The method of claim 1, further comprising (b1) thermally treating the graphene exposed to ammonium fluoride ($NH_4F$), subsequent to (b).

5. The method of claim 4, wherein thermally treating in (b1) is performed under a process condition that part or all of the ammonium ions physisorbed to the graphene are converted into pyrrolic-N, pyridinic-N, or graphitic-N.

6. A method of manufacturing an electrical component including n-doped graphene, comprising:
    (c) forming graphene on a substrate;
    (d) forming source and drain electrodes;
    (e) etching the graphene, thus forming a graphene pattern; and
    (f) exposing the graphene pattern formed on the substrate to ammonium fluoride ($NH_4F$);
    wherein exposing the graphene pattern to the ammonium fluoride ($NH_4F$) in (f) is performed using any one or a combination of two or more selected from among a process of immersing a substrate having a graphene pattern in an ammonium fluoride ($NH_4F$) aqueous solution, a process of spraying an ammonium fluoride ($NH_4F$) aqueous solution onto a graphene channel, and a process of spin coating a graphene channel with an ammonium fluoride ($NH_4F$) aqueous solution.

7. The method of claim 6, wherein in (c), the substrate comprises silicon nitride, silicon oxide, polyethylene terephthalate or polyimide.

8. The method of claim 6, wherein exposing the graphene pattern to the ammonium fluoride ($NH_4F$) in (f) is additionally performed using a process of exposing a graphene channel to an ammonium fluoride ($NH_4F$) vapor.

9. The method of claim 6, wherein an extent of doping of the graphene pattern in (f) is controlled by adjusting at least one of a concentration, a temperature and a treatment time of the ammonium fluoride ($NH_4F$) aqueous solution to a predetermined range.

10. The method of claim 6, further comprising (g) thermally treating the graphene pattern exposed to ammonium fluoride ($NH_4F$), subsequent to (f).

11. The method of claim 10, wherein thermally treating in (g) is performed under a process condition that part or all of the ammonium ions physisorbed to the graphene pattern are converted into pyrrolic-N, pyridinic-N, or graphitic-N.

12. The method of claim 6, further comprising (h) forming a protective film on the graphene pattern, subsequent to (f).

13. The method of claim 12, wherein forming the protective film in (h) is performed using any one process selected from among atomic layer deposition, chemical vapor deposition, spin coating, and screen printing.

14. The method of claim 12, wherein in (h), the protective film comprises any one selected from among Aluminum oxide, Silicon oxide, Hafnium oxide, Zirconium oxide, Lanthanum oxide, Tungsten oxide, Boron nitride, Polyvinylpyrrolidone, Polyvinylphenol, Polytrivinyltrimethylcyclotrisiloxane(pV3D3) and Polytetravinyltetramethylcyclotetrasiloxane(pV4D4).

* * * * *